(12) United States Patent
Furuta

(10) Patent No.: US 7,989,846 B2
(45) Date of Patent: Aug. 2, 2011

(54) SEMICONDUCTOR DEVICE WITH THREE-DIMENSIONAL FIELD EFFECT TRANSISTOR STRUCTURE

(75) Inventor: Hiroshi Furuta, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 482 days.

(21) Appl. No.: 12/216,061

(22) Filed: Jun. 27, 2008

(65) Prior Publication Data

US 2009/0008721 A1 Jan. 8, 2009

(30) Foreign Application Priority Data

Jul. 2, 2007 (JP) ................................. 2007-173807

(51) Int. Cl.
*H01L 29/78* (2006.01)
(52) U.S. Cl. ........ 257/206; 257/351; 257/369; 257/401; 257/E29.275
(58) Field of Classification Search .................... 257/373
See application file for complete search history.

(56) References Cited

U.S. PATENT DOCUMENTS

| 7,112,858 | B2 | 9/2006 | Inaba et al. |
| 2004/0031004 | A1 | 2/2004 | Yoshioka |
| 2004/0144979 | A1 * | 7/2004 | Bhattacharyya ................ 257/67 |
| 2004/0238894 | A1 | 12/2004 | Furuta |
| 2005/0205938 | A1 | 9/2005 | Yagishita |

FOREIGN PATENT DOCUMENTS

| JP | 2004-072017 A | 3/2004 |
| JP | 2004-363136 A | 12/2004 |
| JP | 2005-116969 A | 4/2005 |
| JP | 2005-197462 A | 7/2005 |
| JP | 2006-019578 A | 1/2006 |

OTHER PUBLICATIONS

Z. Guo et al., "FinFET-Based SRAM Design," International Symposium on Low Power Electronics and Design, 2005, pp. 2-7.

* cited by examiner

*Primary Examiner* — Stephen W Smoot
(74) *Attorney, Agent, or Firm* — Foley & Lardner LLP

(57) ABSTRACT

The semiconductor device includes first and second common source semiconductor layers respectively extending in a first direction, first and second logic gate circuits respectively composed of at least one three-dimensional P-type FET and a three-dimensional N-type FET. The sources of the three-dimensional P-type FETs in the first and second logic gate circuits are joined to the first common source semiconductor layer. The sources of the three-dimensional N-type FETs in the first and second logic gate circuits are joined to the second common source semiconductor layer. The semiconductor layers of the three-dimensional P-type and N-type FETs in the first logic gate circuit are joined in their drain side, and The semiconductor layers of the three-dimensional P-type and N-type FETs in the second logic gate circuit are joined in their drain side. The dissipation of the FinFET can be improved.

21 Claims, 13 Drawing Sheets

SEMICONDUCTOR DEVICE WITH THREE-DIMENSIONAL FIELD EFFECT TRANSISTOR STRUCTURE

INCORPORATION BY REFERENCE

This patent application is based on Japanese Patent Application No. 2007-173807. The disclosure of the Japanese Patent Application is incorporated herein by reference.

BACKGROUND OF THE INVENTION

1. Field of the Invention

The present invention relates to a semiconductor device, in particular, a semiconductor device having a three-dimensional structure MISFET (hereinafter, referred to a "three-dimensional FET").

2. Description of Related Art

As a method of reducing the size of the MISFET (to achieve effects such as a suppression of short channel effect), the so-called three-dimensional FET is used for improving channel charge control capability of the gate electrode in place of a typical planar MISFET. The three-dimensional FET is a type of SOI (silicon on insulator) devices. The fin MISFET (FinFET) and the double gate FET (DG-FET) are typical three-dimensional FETs.

As an example of the three-dimensional FET, an SRAM (static random access memory) formed of a FinFET is disclosed in the following document: Zheng Guo et al., "FinFET-Based SRAM Design", International Symposium on Low Power Electronics and Design, pp. 2-7, 2005 (ISLPED '05). In this technique, by adopting the FinFET as an FET of the SRAM, an SRAM with small cell size can be realized.

With regard to devices including the three-dimensional FET including the Fin FET or the planar SOI, the heat generation often becomes troublesome. For improving the heat dissipation of such devices, various techniques has been investigated. However, most of such investigations are directed to the planar SOI device, and the three-dimensional FET has not been sufficiently considered. The heat dissipation of the three-dimensional FET must be considered from different viewpoints from the planar SOI device, since their structures are different to each other. Particularly, in the planar SOI device, the device isolation is performed by partially oxidizing a semiconductor layer (SOI layer) formed on the whole surface of a wafer, while, in the three-dimensional FET, the device isolation is performed by forming semiconductor layers separately on an insulating film. Generally, the heat dissipation is more important technical issue for the three-dimensional FET than the planar SOI device.

More specifically, Japanese Laid-Open Patent Application JP-P2004-72017A discloses a technique for using metal interconnections on an upper layer of the planar SOI device as a heat dissipator. Japanese Laid-Open Patent Application JP-P2004-363136A discloses a structure of the planar SOI device in which a gate electrode of MOSFET used as an ESD protection element is shaped as a ring and a source region is separated from the outside of a source region with a shield plate electrode. With such structure, since the SOI layer forms continuous area, the heat dissipation efficiency is improved. In Japanese Laid-Open Patent Application JP-P2005-197462A, even the heat dissipation problem is not described, a structure in which a gate electrode and a channel region (referred to as a "well" in this document) become shorted is disclosed. With the structure disclosed in this document, a well of a P-type FET is joined with a well of an N-type FET by p-n junction.

Japanese Laid-Open Patent Application JP-P2006-19578A discloses the heat dissipation of the FinFET. This document discloses a structure in which a gate electrode and a channel region are shorted to reduce power consumption of a FinFET and suppress short channel effect. With this structure, the heat generated in a source and a drain is dissipated through a gate electrode.

Japanese Laid-Open Patent Application JP-P2005-116969A discloses an inverter circuit chain, which is one of the techniques of a logic circuit formed by using the three-dimensional FET. FIG. 1 in this document shows a layout diagram of the inverter circuit chain. In this figure, sources of an inverter circuit (104, 105) are not coupled to each other by a semiconductor layer (there is no common semiconductor layer) but are electrically connected to each other with a metal interconnection (106, 107 are source electrode interconnections). Generally, when the three-dimensional FET forms a functional circuit obtained by combining logic gate circuits, sources of FET each forming the logic gate circuit are connected to each other with a metal interconnection as this document JP-P2005-116969A. Accordingly, with such structure, since the heat from the metal interconnection is dissipated from a semiconductor layer through a contact plug, the amount of dissipated heat is limited by the thermal resistance of the contact plug. As a result, heat exhaustion of the semiconductor layer is limited by the thermal resistance of the contact plug.

SUMMARY

However, the present inventor has recognized that, in the FinFETs disclosed in Japanese Laid-Open Patent Application JP-P2006-19578A and JP-P2005-116969A, since a fin layer which a source, a channel and a drain thereon is isolatedly formed, it is difficult to dissipate the heat generated during the operation of the FinFET.

Since the drain is generally connected to a metal interconnection, a method may be considered in which many contacts are provided on the drain for heat dissipation or that a metal interconnection having a large area is adopted. However, such method is not preferable since it increases the capacity of the drain.

Therefore, an object of the present invention is to provide a technique for performing sufficient heat dissipation, especially in the case of the three-dimensional FET.

In one embodiment of the present invention, a semiconductor device includes: a first common source semiconductor layer configured to extend in a first direction; a second common source semiconductor layer configured to extend in the first direction; a first logic gate circuit composed of at least one three-dimensional P-type FET and a three-dimensional N-type FET; and a second logic gate circuit composed of at least one three-dimensional P-type FET and a three-dimensional N-type FET. A source of the three-dimensional P-type FET in the first logic gate circuit and a source of the three-dimensional P-type FET in the second logic gate circuit are joined to the first common source semiconductor layer. A source of the three-dimensional N-type FET in the first logic gate circuit and a source of the three-dimensional N-type FET in the second logic gate circuit are joined to the second common source semiconductor layer. A drain of the three-dimensional P-type FET of the first logic gate circuit and a drain of the three-dimensional N-type FET of the first logic gate circuit are joined to each other. A drain of the three-dimensional P-type FET of the second logic gate circuit and a drain of the three-dimensional N-type FET of the second logic gate circuit are joined to each other.

In another embodiment of the present invention, a semiconductor device includes: a first common source semiconductor layer configured to extend in a first direction; a second common source semiconductor layer configured to extend in the first direction; and a first to k-th logic gate circuits respectively include at least one set of a three-dimensional P-type FET and a three-dimensional N-type FET. A source of at least one of the three-dimensional P-type FET is joined to the first common source semiconductor layer. A source of at least one of the three-dimensional N-type FET is joined to the second common source semiconductor layer. Drains of the three-dimensional P-type FET and the three-dimensional N-type FET which belong a same set of the at least one set are joined to each other, and the at least one set of a three-dimensional P-type FET and a three-dimensional N-type FET are joined to each other at least k points.

According to the present invention, the heat generated in the three-dimensional FET can be efficiently dissipated.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Figure 1:
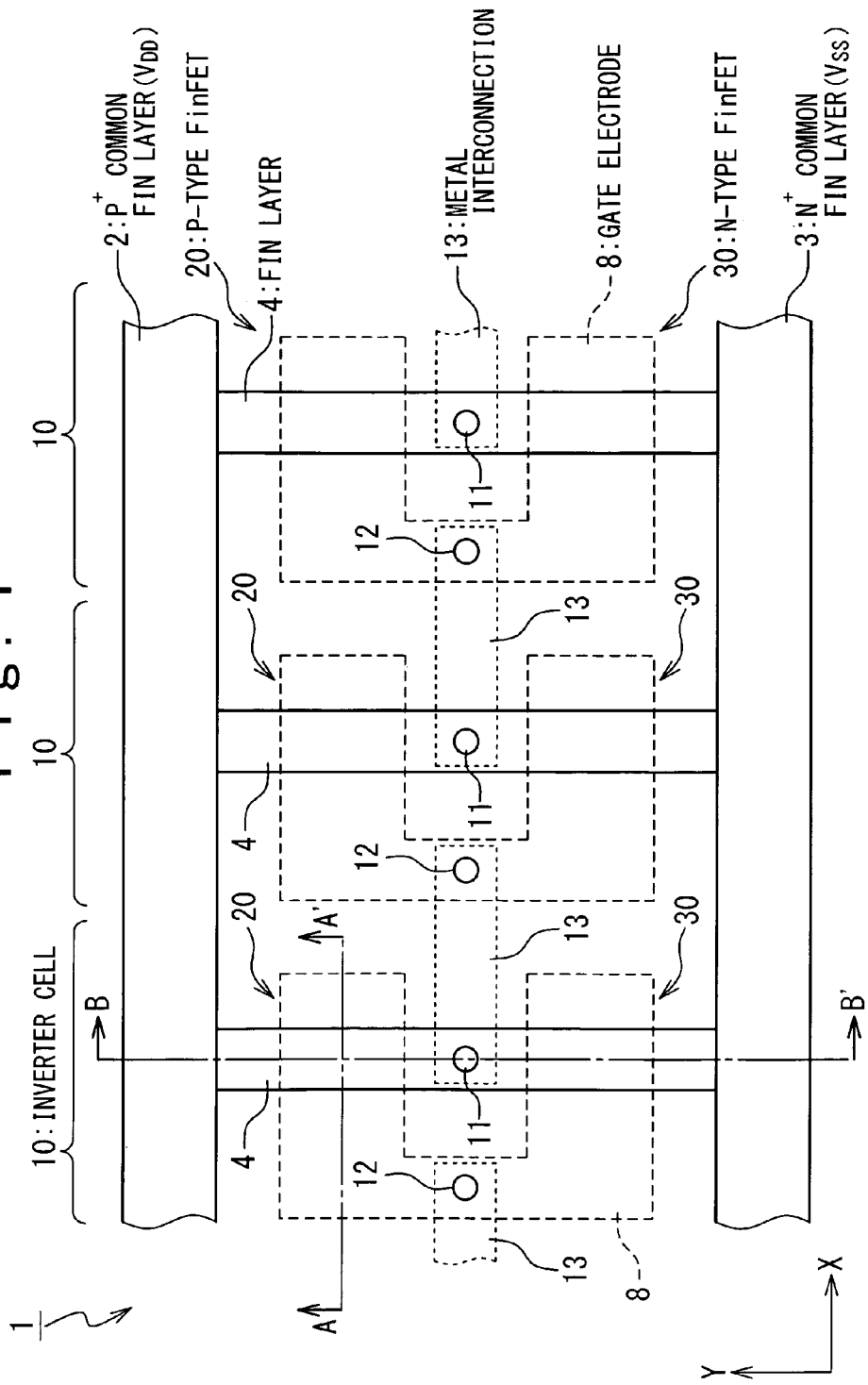
FIG. 1 is a plan view showing a configuration of a semiconductor device according to a first embodiment of the present invention.

Hereinafter, embodiments of the present invention will be described in detail referring to the attached drawings. Note that, in the drawings, same or similar reference numerals are given to same or similar parts.

First Embodiment

Hereinafter, a FinFET will be used for explanation as a typical example of three-dimensional FET. FIG. 1 is a plan view showing a layout of a semiconductor device 1 according to a first embodiment of the present invention. The semiconductor device 1 in FIG. 1 is formed of serially-connected three-stage inverter circuits 10. Each inverter circuit 10 has a P-type FinFET 20 and an N-type FinFET 30. In the semiconductor device 1 in FIG. 1, inverter circuits 10 are aligned in the X-axis direction and a signal is transmitted in a +X direction. A structure of the semiconductor device 1 will be described in detail below.

The semiconductor device 1 has a P+ common source semiconductor layer 2 and an N+ common source semiconductor layer 3 which extend in the X-axis direction. Here, the semiconductor layers can also be called as semiconductor blocks. The P+ common source semiconductor layer 2 is a semiconductor layer into which p-type impurities are doped at high concentration and is connected to a power supply level wiring (not shown). Here, the power supply level wiring is a metal interconnection having a power supply potential level $V_{DD}$. While, the N+ common source semiconductor layer 3 is a semiconductor layer into which N-type impurities are doped at high concentration and is connected to a ground level wiring (not shown). The ground level wiring is a metal interconnection having a ground level potential $V_{SS}$.

Figure 2:
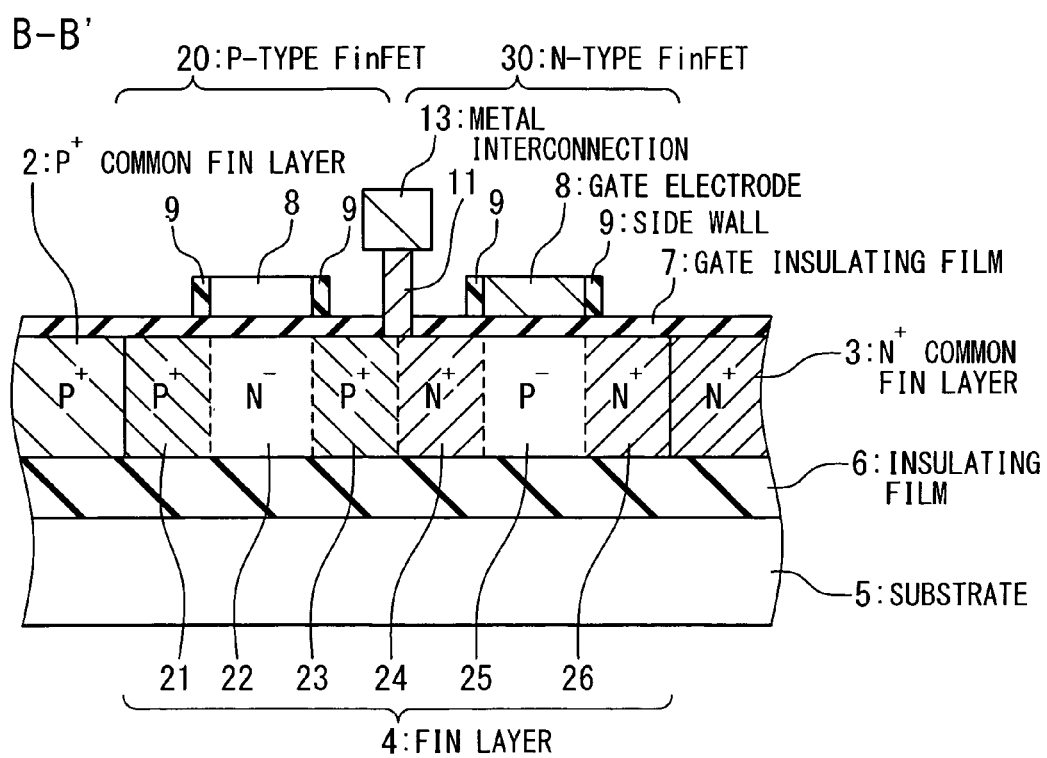
FIG. 2 is a sectional view showing a configuration of the semiconductor device taken along a line B-B' in FIG. 1.

The P+ common source semiconductor layer 2 and the N+ common source semiconductor layer 3 are connected to a fin layer 4. Here, the fin layer 4 is a semiconductor layer on which sources, channels and drains of the P-type FinFET 20 and the N-type FinFET 30 are formed. As shown in FIG. 2, the P+ common source semiconductor layer 2, the N+ common source semiconductor layer 3 and the fin layer 4 are formed on an insulating film 6 formed on a substrate 5. In FIG. 2, the P+ common source semiconductor layer 2, the N+ common source semiconductor layer 3 and the fin layer 4 are separated by lines. In fact, however, there is no definite physical boundary between the P+ common source semiconductor layer 2 and the fin layer 4, and between the N+ common source semiconductor layer 3 and the fin layer 4.

A source region 21, a channel region 22 and a drain region 23 of the P-type FinFET 20 and a drain region 24, a channel region 25 and a source region 26 of the N-type FinFET 30 are formed on the fin layer 4. The source region 21 and the drain region 23 are semiconductor regions into which p-type impurities are doped at high concentration, and the channel region 22 is a semiconductor region into which N-type impurities are doped at low concentration. The drain region 24 and the source region 26 are semiconductor regions into which N-type impurities are doped at high concentration, and the channel region 25 is a semiconductor region into which p-type impurities are doped at low concentration. The source region 21 of the P-type FinFET 20 is joined to the P+ common source semiconductor layer 2 and the source region 26 of the N-type FinFET 30 is joined to the N+ common source semiconductor layer 3. The source region 21, the channel region 22 and the drain region 23 of the P-type FinFET 20 and the drain region 24, the channel region 25 and the source region 26 of the N-type FinFET 30 are aligned in the Y-axis direction (perpendicular to the X-axis direction).

Note that, in the structure shown in FIG. 2, the drain region 23 of the P-type FinFET 20 is physically as well as electrically joined (coupled) to the drain region 24 of the N-type FinFET 30. In the present embodiment, a fin layer which forms the P-type FinFET 20 thereon and a fin layer which forms the N-type FinFET 30 thereon are physically integrated into each other. As described later, such structure is effective to improve heat dissipation.

Figure 3:
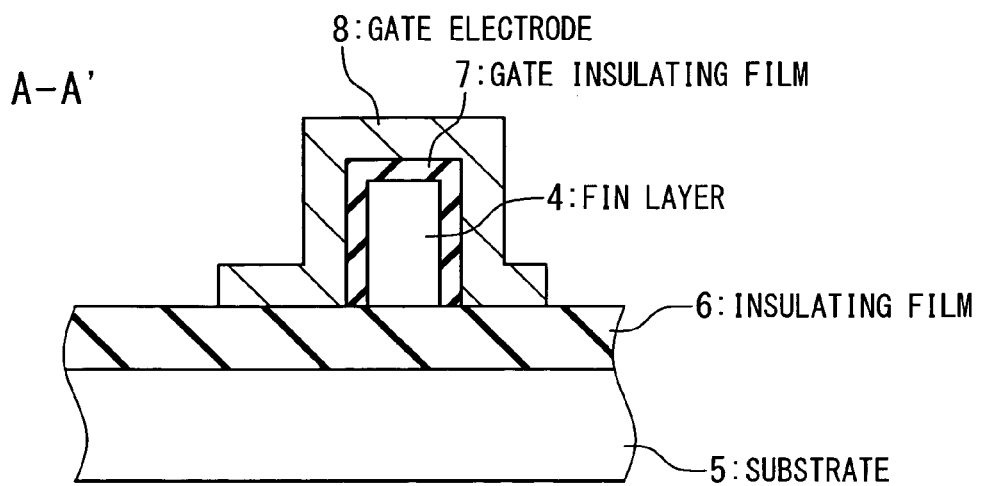
FIG. 3 is a sectional view showing a configuration of the semiconductor device taken along a line A-A' in FIG. 1.

As shown in FIG. 3, a gate insulating film 7 is formed so as to cover side surfaces and a top surface of the fin layer 4, and a gate electrode 8 is formed on the gate insulating film 7. The gate electrode 8 is formed so as to cover the channel regions 22, 25 of the P-type FinFET 20 and the N-type FinFET 30, respectively. As shown in FIG. 2, a side wall 9 is formed on side surfaces of the gate electrode 8.

As shown in FIG. 1, the semiconductor device 1 is further provided with a contact 11 connected to the fin layer 4, a contact 12 connected to the gate electrode 8 and a metal interconnection 13 connecting the contact 11 to the contact 12. As shown in FIG. 2, the contact 11 is formed so as to be connected to both the drain region 23 of the P-type FinFET 20 and the drain region 24 of the N-type FinFET 30. The metal interconnection 13 is used to transmit a signal between adjacent inverter circuits 10.

One feature of the semiconductor device 1 in the present embodiment is that the fin layer 4 is formed so as to join the $P^+$ common source semiconductor layer 2 and the $N^+$ common source semiconductor layer 3. In the semiconductor device 1 shown in FIG. 1, a drain region of the P-type FinFET 20 is electrically and physically joined to a drain region of the N-type FinFET 30. With such configuration, since heat generated in the fin layer 4 can be dissipated through both the $P^+$ common source semiconductor layer 2 and the $N^+$ common source semiconductor layer 3, heat dissipation effect is high. Furthermore, by increasing the width of the $P^+$ common source semiconductor layer 2 or the $N^+$ common fin layer 3 (that is, increasing the surface area) so as not to have an influence on the layout area, high heat dissipation effect can be obtained. To improve the heat dissipation, it is desired that the widths of the $P^+$ common source semiconductor layer 2 and the $N^+$ common source semiconductor layer 3 are larger than that of the fin layer 4 and that the sum of the pattern area of the $P^+$ common source semiconductor layer 2 and the $N^+$ common source semiconductor layer 3 is greater than that of the fin layer 4.

In the present embodiment, note that the fin layer 4 on which the FinFETs constituting each inverter circuit 10 are formed is joined to the $P^+$ common source semiconductor layer 2 and the $N^+$ common source semiconductor layer 3 so that the $P^+$ common source semiconductor layer 2, the $N^+$ common source semiconductor layer 3 and the fin layer 4 forms quadrangular (rectangle) loop. In the semiconductor device shown in FIG. 1, three inverter circuits 10 are serially connected, thereby forming two rectangle loops with the $P^+$ common source semiconductor layer 2, the $N^+$ common source semiconductor layer 3 and the fin layers 4. Generally, k inverter circuits 10 form k−1 rectangular loops. It is preferred for heat dissipation that the $P^+$ common source semiconductor layer 2, the $N^+$ common source semiconductor layer 3 and the fin layers 4 form as many rectangular loops as possible. In the case where k is large, the $P^+$ common source semiconductor layer 2, the $N^+$ common source semiconductor layer 3 and the fin layers 4 may be laid out so that about k/2 rectangular loops are formed. It is also desirable to form other polygonal loops more than quadrangular loop such as the pentagonal loop.

Note that, with the structure of the semiconductor device 1 in the present embodiment, the drain capacity of the P-type FinFET 20 and the N-type FinFET 30 need not be increased for heat dissipation. As mentioned before, even though a structure that many contacts are provided on a drain or a metal interconnection having a large area is connected is effective to improve the heat dissipation characteristic of the drain, the drain capacity is increased. On the contrary, the structure of the semiconductor device 1 in the present embodiment does not lead to an increase in drain capacity.

In addition, with the configuration of the semiconductor device 1 in the present embodiment, since the drain region of the P-type FinFET 20 is directly joined (coupled) to the drain region of the N-type FinFET 30, the layout area can be reduced.

The configuration of the semiconductor device 1 in the present embodiment is also preferable in that the size of each inverter circuit 10 in the X-axis direction can be reduced. In the configuration shown in FIG. 1, the source region 21, the channel region 22 and the drain region 23 of the P-type FinFET 20, and the drain region 24, the channel region 25 and the source region 26 of the N-type FinFET 30 are linearly aligned in the Y-axis direction. Such arrangement enables reduction in the size of each inverter circuit 10 in the X-axis direction.

In the structure shown in FIG. 2, the drain region 23 of the P-type FinFET 20 is joined to the drain region 24 of the N-type FinFET 30. With such configuration, there is possibility that an undesired mutual diffusion of impurities occurs. The mutual diffusion has an undesired effect on characteristics of the P-type FinFET 20 and the N-type FinFET 30.

Figure 4:
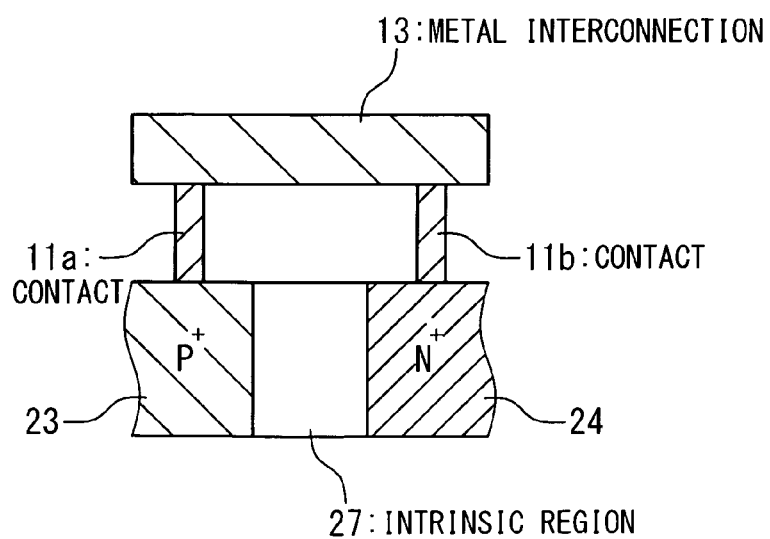
FIG. 4 is a sectional view showing another configuration of a junction between drains of a three-dimensional P-type FET (P-type FinFET) and a three-dimensional N-type FET (N-type FinFET)

A method for avoiding such problem is to separate the channel region 22 of the P-type FinFET 20 from the drain region 24 of the N-type FinFET 30, and the channel region 25 of the N-type FinFET 30 from the drain region 23 of the P-type FinFET 20 by a sufficient distance. If necessary, as shown in FIG. 4, an intrinsic region 27 into which impurities due to the ion implantation are not doped may be provided between the drain regions 23, 24. In this case, contacts 11*a*, 11*b* connected to the drain regions 23, 24, respectively, are formed and the metal interconnection 13 connected to both the contacts 11*a*, 11*b* is formed on an upper layer.

Although not shown, the $P^+$ common source semiconductor layer 2, the $N^+$ common source semiconductor layer 3, and the source regions and the drain regions, except for channel regions of the fin layer 4 may have metal silicide structure. That is, a part or all of surfaces of the $P^+$ common source semiconductor layer 2, the $N^+$ common source semiconductor layer 3, and the source region and the drain region of fin layer 4 may be silicided. The silicidation can improve the heat dissipation effect.

It is preferred that the $P^+$ common source semiconductor layer 2 is connected to the power supply level wiring through a plurality of contacts and the $N^+$ common source semiconductor layer 3 is connected to the ground level wiring through a plurality of contacts. To improve the heat dissipation effect, it is effective to connect the $P^+$ common source semiconductor layer 2 and the $N^+$ common source semiconductor layer 3 to a metal interconnection through many contacts.

Second Embodiment

Figure 5:
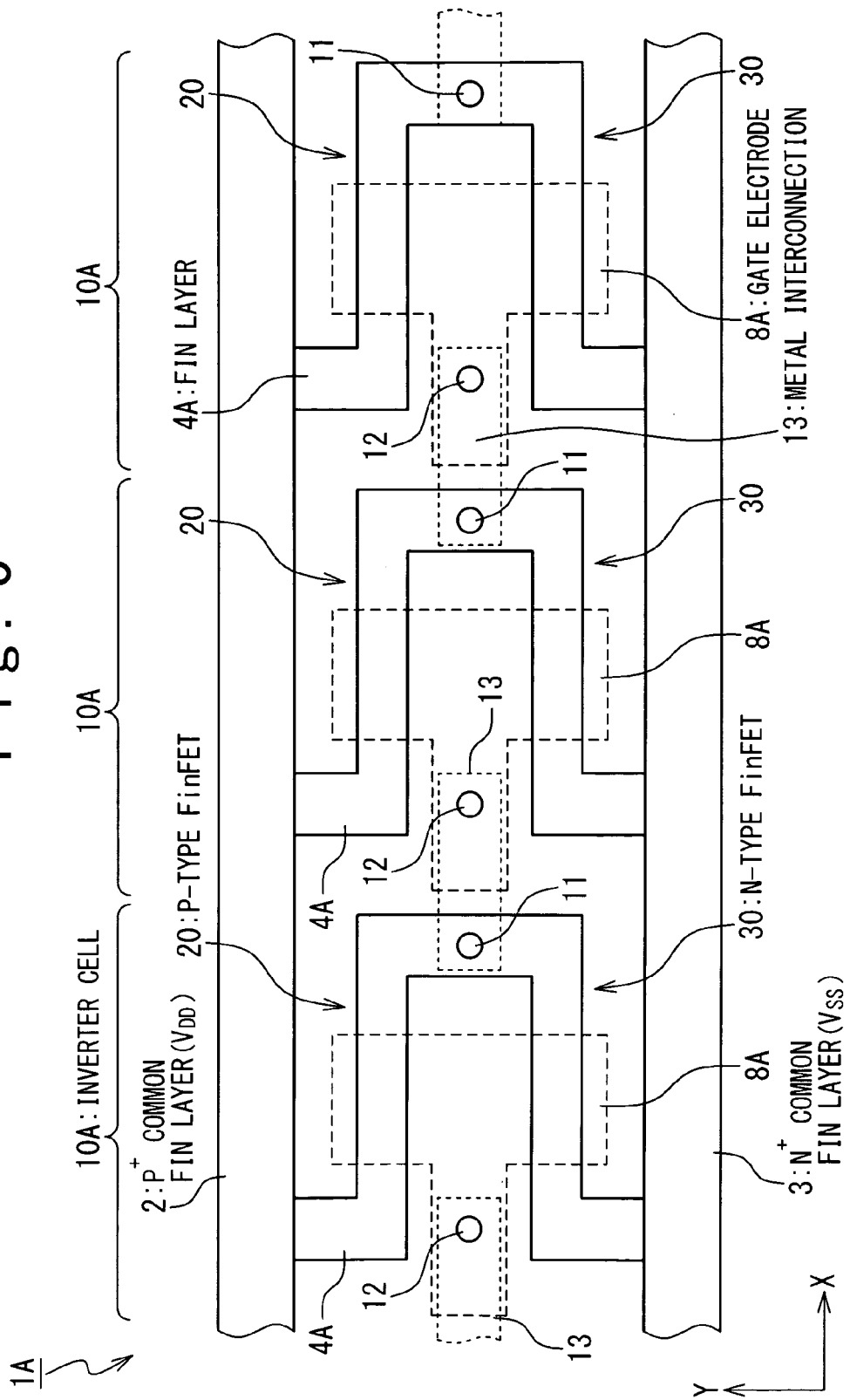
FIG. 5 is a plan view showing a configuration of a semiconductor device according to a second embodiment of the present invention.

FIG. 5 is a plan view showing a configuration of a semiconductor device 1A according to a second embodiment of the present invention. Like the semiconductor device 1 of the first embodiment, the semiconductor device 1A of the second embodiment has serially-connected three-stage inverter circuits 10A. However, the shape of the fin layer and the gate electrode in the semiconductor device 1A of the second embodiment is different from those of the semiconductor device 1 of the first embodiment. In the first embodiment, the fin layer 4 is formed linearly along the Y-axis direction, while, in the second embodiment, a bent fin layer 4A is formed.

Figure 6:
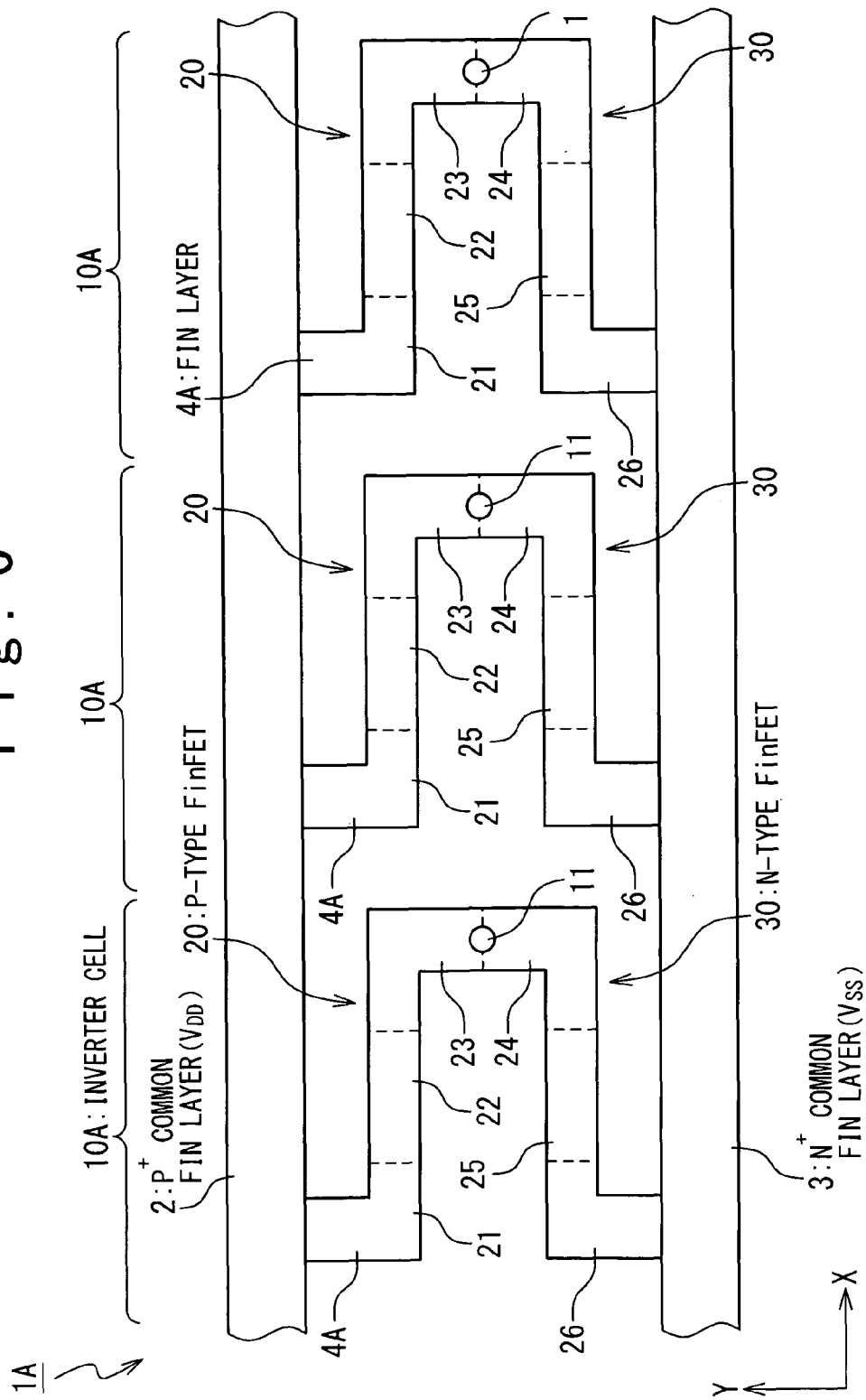
FIG. 6 is a plan view showing a configuration of a fin layer in a second embodiment.

FIG. 6 is a plan view showing a configuration of the fin layer 4A. In the second embodiment, a part of the source region 21, the channel region 22 and a part of the drain region 23 of the P-type FinFET 20 are aligned in the X-axis direction, and a part of the drain region 24, the channel region 25 and a part of the source region 26 of the N-type FinFET 30 are aligned in the X-axis direction. In addition, the channel region 22 of the P-type FinFET 20 and the channel region 25 of the N-type FinFET 30 are aligned in the Y-axis direction. As shown in FIG. 5, the gate electrode 8A is formed so as to cover the channel region 22 of the P-type FinFET 20 and the channel region 25 of the N-type FinFET 30.

With the structure in the second embodiment, as in the first embodiment, the fin layer 4A is formed so as to connect the P$^+$ common source semiconductor layer 2 to the N$^+$ common source semiconductor layer 3. Accordingly, the heat generated in the fin layer 4A can be dissipated through the P$^+$ common source semiconductor layer 2 and the common source semiconductor layer 3 and thus heat dissipation effect is large. In addition, the structure of the second embodiment is also preferable in that the size of each inverter circuit 10A can be reduced in the Y-axis direction. Although the size of a preferable logic gate circuit is different depending on whole layout of the chip, the integration degree of the logic circuit can be increased by properly using the structures of the first and second embodiments.

Third Embodiment

Figure 7:
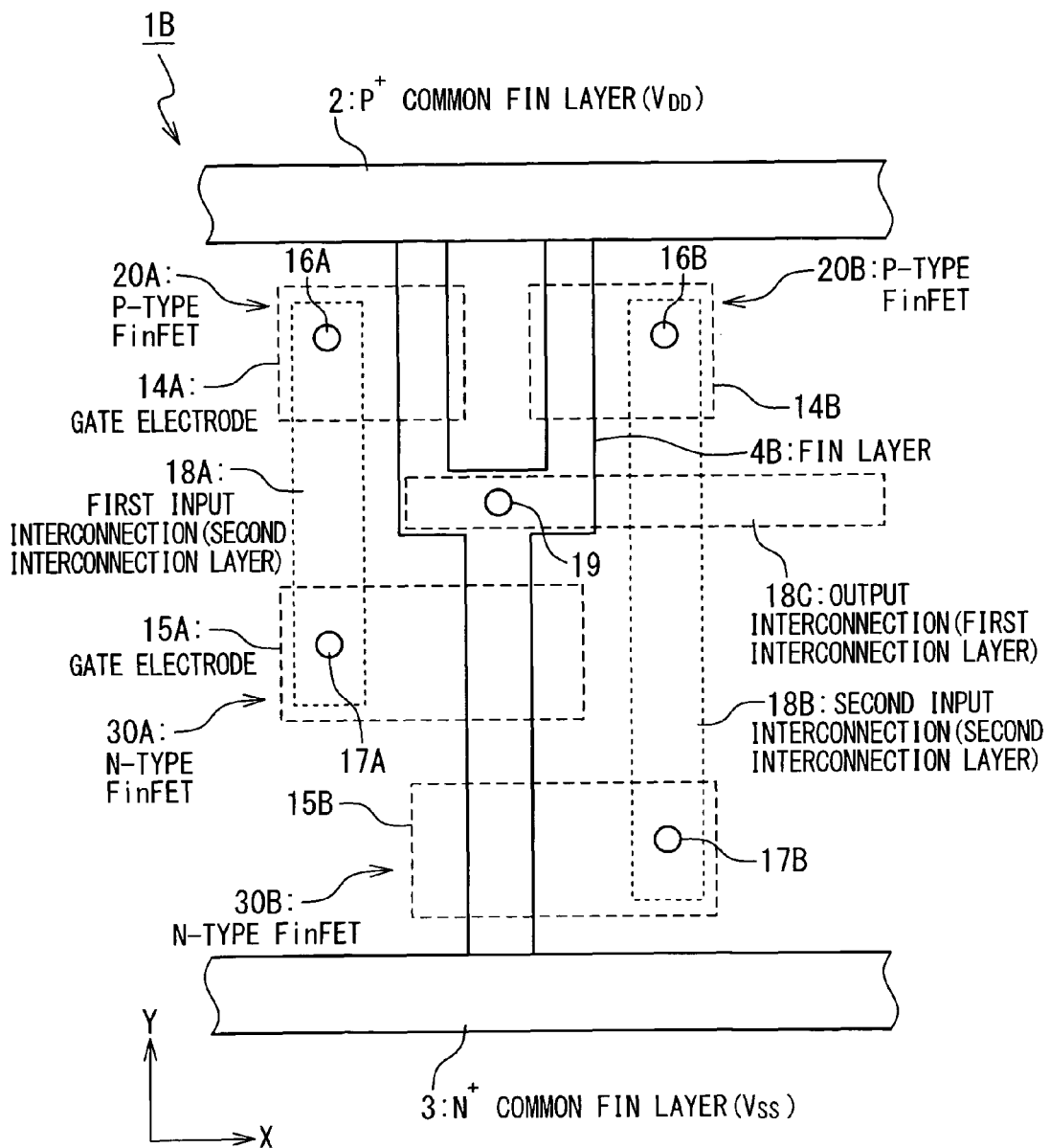
FIG. 7 is a plan view showing a configuration of a semiconductor device according to a third embodiment of the present invention.

FIG. 7 is a plan view showing a configuration of a semiconductor device 1B according to a third embodiment. The semiconductor device 1B of the third embodiment functions as a NAND circuit having a P-type FinFETs 20A, 20B and N-type FinFETs 30A, 30B.

More specifically, the semiconductor device 1B has a fin layer 4B connecting the P$^+$ common source semiconductor layer 2 to the N$^+$ common source semiconductor layer 3. The fin layer 4B is divided into branches. Specifically, the fin layer 4B is formed of a part on which the P-type FinFET 20A is formed, a part on which the P-type FinFET 20B is formed and a part on which the N-type FinFETs 30A, 30B are serially arranged. One end of each of the parts on which P-type FinFETs 20A, 20B are formed is joined to the P$^+$ common source semiconductor layer 2 and the other end of each of the parts is joined to one end of the part on which the N-type FinFETs 30A, 30B are formed. The other end of the part on which the N-type FinFETs 30A, 30B are formed is joined to the N$^+$ common source semiconductor layer 3.

Figure 8A:
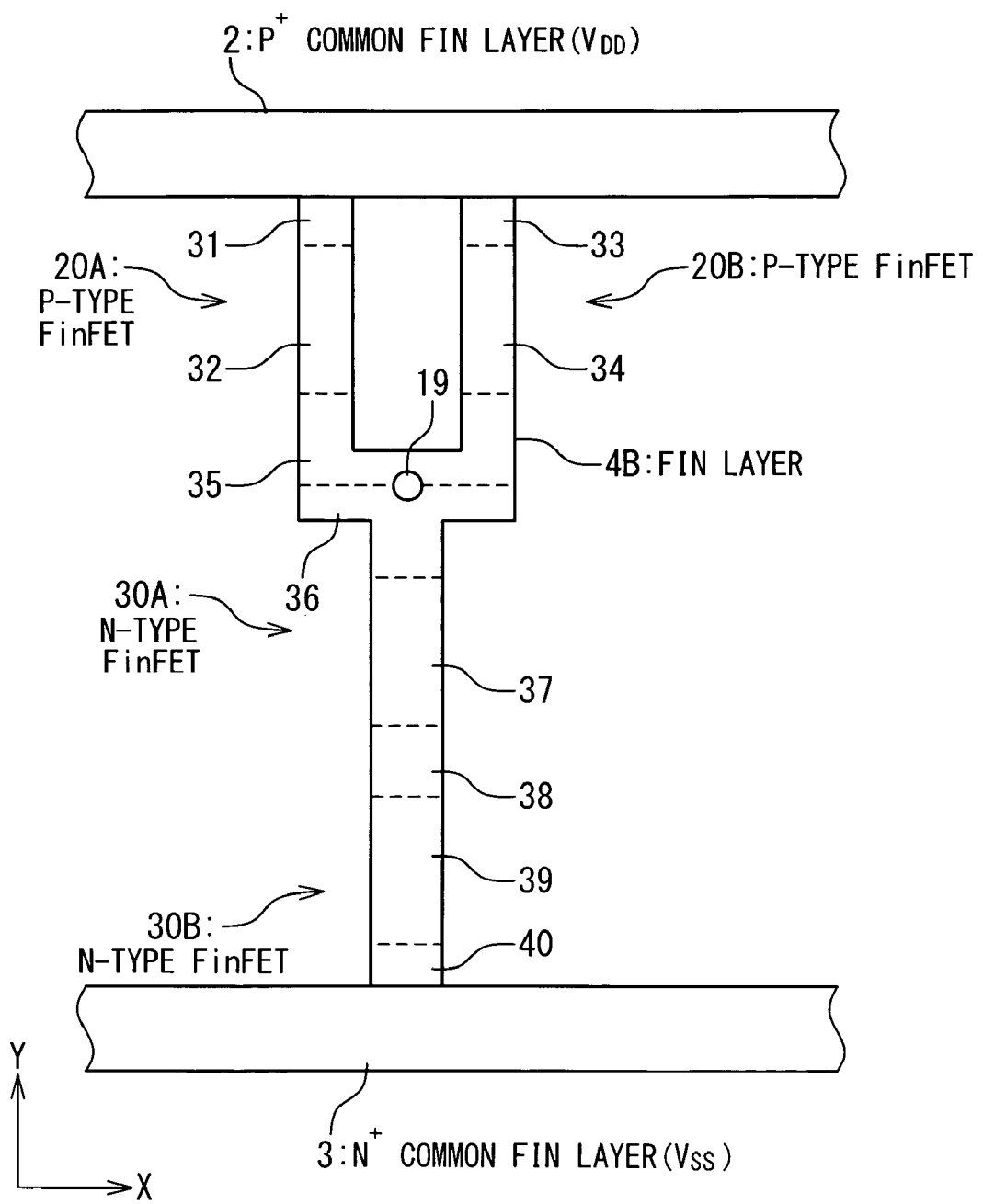
FIG. 8A is a plan view showing a configuration of a fin layer in a third embodiment.

FIG. 8A is a detailed plan view showing a configuration of the fin layer 4B. The following regions are formed on the fin layer 4B:

(1) a source region 31 and a channel region 32 of the P-type FinFET 20A;

(2) a source region 33 and a channel region 34 of the P-type FinFET 20B; and (3) a common drain region 35 which serves as a common drain of the P-type FinFETs 20A, 20B.

The source region 31 and the channel region 32 of the P-type FinFET 20A are aligned between the common drain region 35 and the P$^+$ common source semiconductor layer 2 in the Y-axis direction. Similarly, the source region 33 and the channel region 34 of the P-type FinFET 20B are aligned between the common drain region 35 and the P$^+$ common source semiconductor layer 2 in the Y-axis direction. As shown in FIG. 7, the channel region 32 of the P-type FinFET 20A is covered with a gate electrode 14A and the channel region 34 of the P-type FinFET 20B is covered with a gate electrode 14B.

Furthermore, following regions are formed on the fin layer 4B:

(4) a drain region 36 and a channel region 37 of the N-type FinFET 30A;

(5) a source/drain region 38 which functions as a drain of the N-type FinFET 30A as well as a source of the N-type FinFET 30B; and (6) a channel region 39 and a source region 40 of the N-type FinFET 30B.

The drain region 36, the channel region 37, the source/drain region 38, the channel region 39, and the source region 40 which constitute the N-type FinFETs 30A, 30B are aligned between the common drain region 35 of the P-type FinFETs 20A, 20B and the N$^+$ common source semiconductor layer 3 in the Y-axis direction. The drain region 36 of the N-type FinFET 30A is joined to the common drain region 35 of the P-type FinFETs 20A, 20B. As shown in FIG. 7, the channel region 37 of the N-type FinFET 30A is covered with a gate electrode 15A and the channel region 39 of the N-type FinFET 30B is covered with a gate electrode 15B.

As shown in FIG. 7, contacts 16A, 17A are formed on the gate electrode 14A of the P-type FinFET 20A and the gate electrode 15A of the N-type FinFET 30A, respectively. A first input interconnection 18A used as a first input of the NAND circuit is connected to the gate electrodes 14A, 15A through the contacts 16A, 17A.

Similarly, contacts 16B, 17B are formed on the gate electrode 14B of the P-type FinFET 20B and the gate electrode 15B of the N-type FinFET 30B, respectively. A second input interconnection 18B used as a second input of the NAND circuit is connected to the gate electrodes 14B, 15B through the contacts 16B, 17B.

As shown in FIG. 8A, a contact 19 is joined to both the common drain region 35 of the P-type FinFETs 20A, 20B and the drain region 36 of the N-type FinFET 30A. The contact 19 is connected to an output interconnection 18C which functions as an output of the NAND circuit. In the present embodiment, the output interconnection 18C is formed on a first interconnection layer (a lowermost metal interconnection layer), and the first input interconnection 18A and the second input interconnection 18B are formed on a second interconnection layer (a second metal interconnection layer from the bottom).

As in the first and second embodiments, the semiconductor device 1B of the third embodiment expresses a high heat dissipation capability. Also with the structure in the third embodiment, since the fin layer 4B is formed so as to connect the P$^+$ common source semiconductor layer 2 to the N$^+$ common source semiconductor layer 3, the heat generated in the fin layer 4B can be dissipated through the P$^+$ common source semiconductor layer 2 and the N$^+$ common source semiconductor layer 3. Accordingly, high heat dissipation effect can be obtained.

Figure 8B:
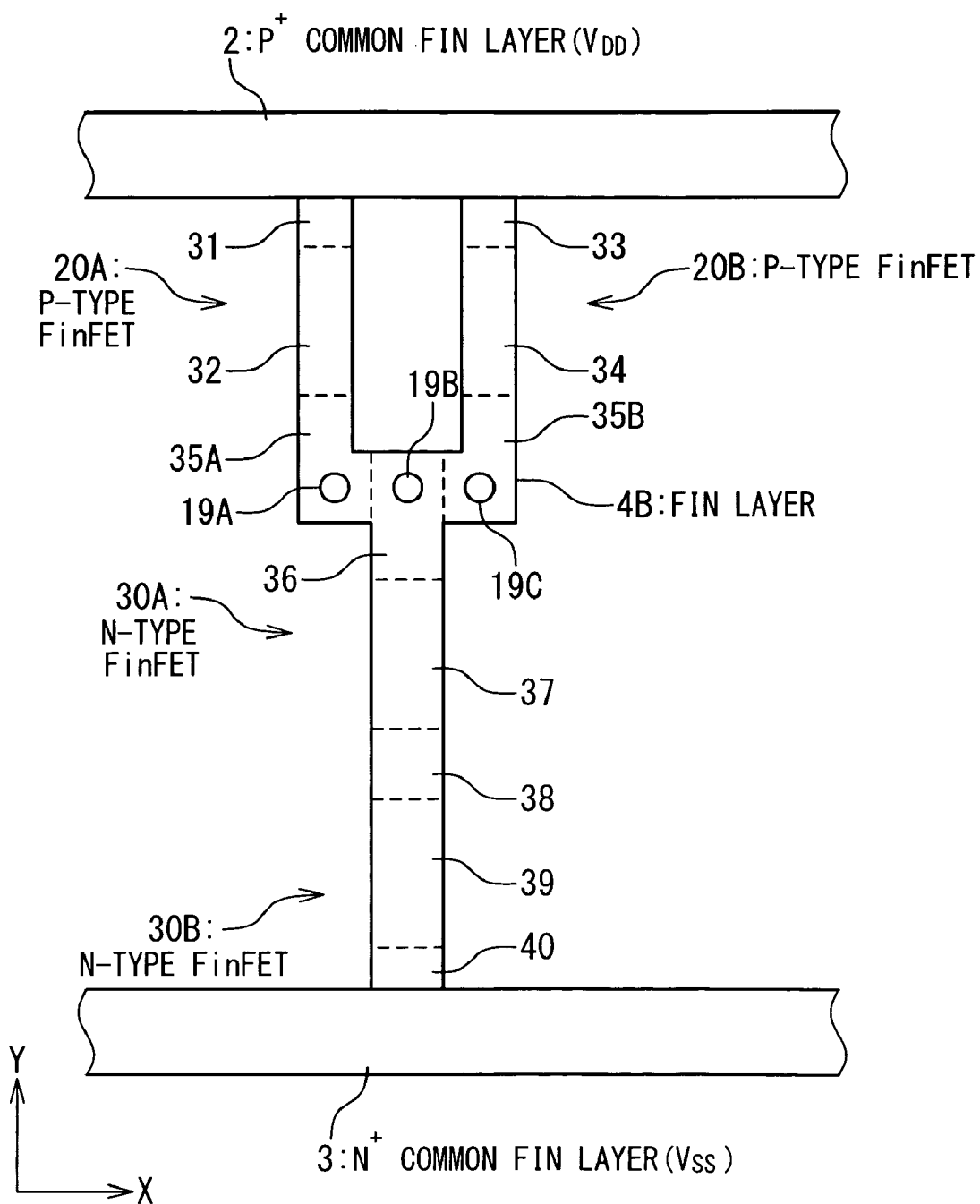
FIG. 8B is a plan view showing another configuration of the fin layer in a third embodiment.

In the present embodiment, a configuration of a connection between the drains of the P-type FinFETs 20A, 20B and the drain of the N-type FinFETs 30A can be variously changed. For example, it is possible to adopt the configuration as shown in FIG. 8B. In this configuration, a drain region 35A of the P-type FinFET 20A and a drain region 35B of the P-type FinFET 20B may be separately provided and the drain regions 35A, 35B are joined to the drain region 36 of the N-type FinFET 30A. In this case, contacts 19A, 19C are formed on the drain regions 35A, 35B, respectively, a contact 19B is formed on the drain region 36 and these contacts 19A to 19C are commonly connected to the output interconnection 18C. With both the configurations in FIGS. 8A and 8B, the P-type FinFETs 20A, 20B are formed between the drain region 36 of the N-type FinFET 30A and the P+ common source semiconductor layer 2. The configuration shown in FIG. 8A is electrically equivalent to the configuration shown in FIG. 8B.

Using a structure similar to the semiconductor device 1B of the third embodiment, the NOR circuit can be realized. In this case, specifically, the fin layer 4B is formed of a part in which the P-type FinFETs 20A, 20B are serially aligned, a part in which the N-type FinFET 30A is formed and a part in which the N-type FinFET 30B is formed. On end of the part in which the P-type FinFETs 20A, 20B are serially aligned is joined to the P+ common source semiconductor layer 2 and the other end of the part is joined to one end of the part in which the N-type FinFETs 30A, 30B are formed. The other end of the part in which the N-type fins FET 30A, 30B are formed is joined to the N+ common source semiconductor layer 3.

Fourth Embodiment

Figure 9:
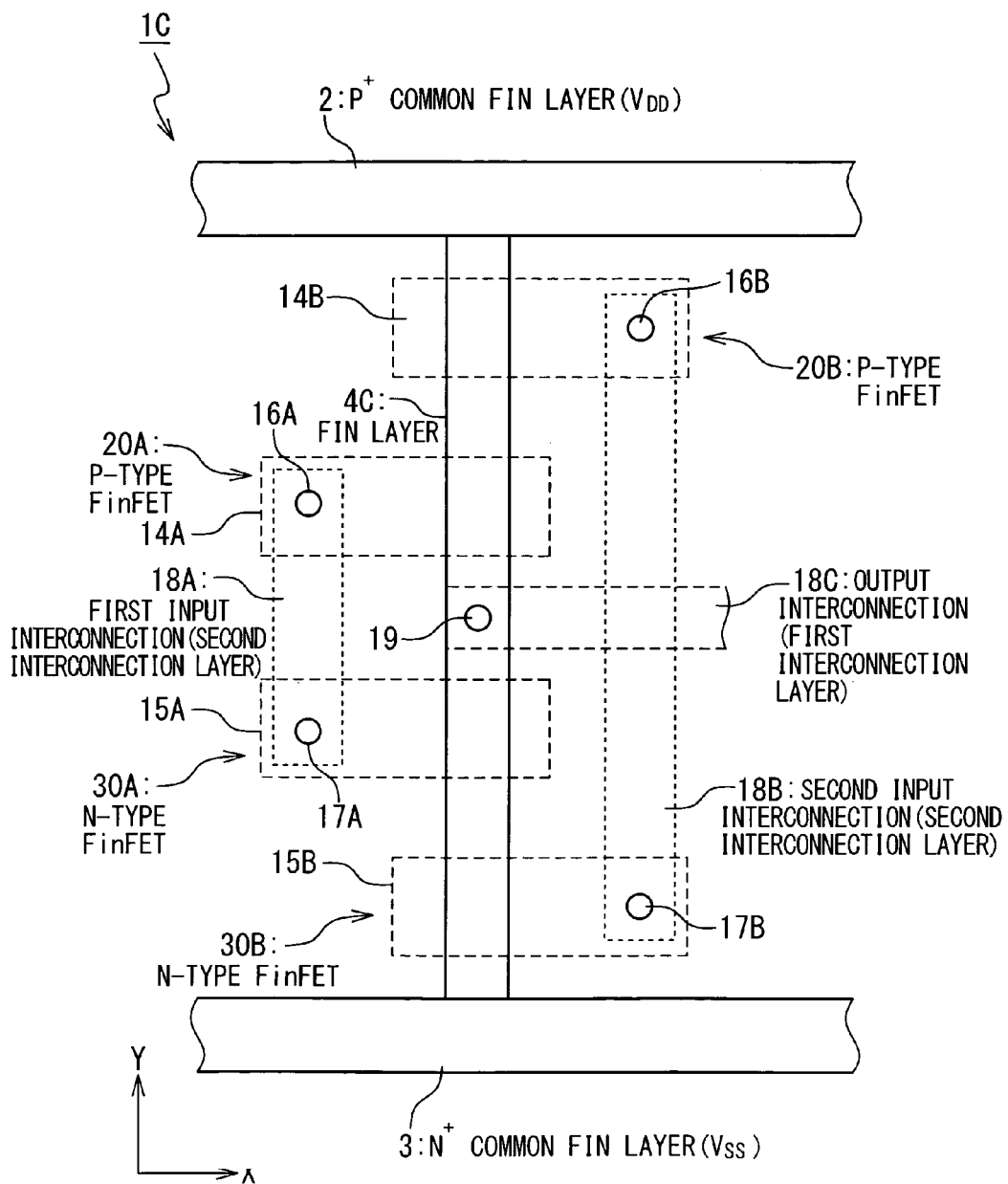
FIG. 9 is a plan view showing a configuration of a semiconductor device according to a fourth embodiment of the present invention.

FIG. 9 is a plan view showing a configuration of a semiconductor device 1C according to a fourth embodiment. The semiconductor device 1C in the fourth embodiment functions as a clocked inverter circuit having P-type FinFETs 20A, 20B and N-type FinFETs 30A, 30B.

Figure 10:
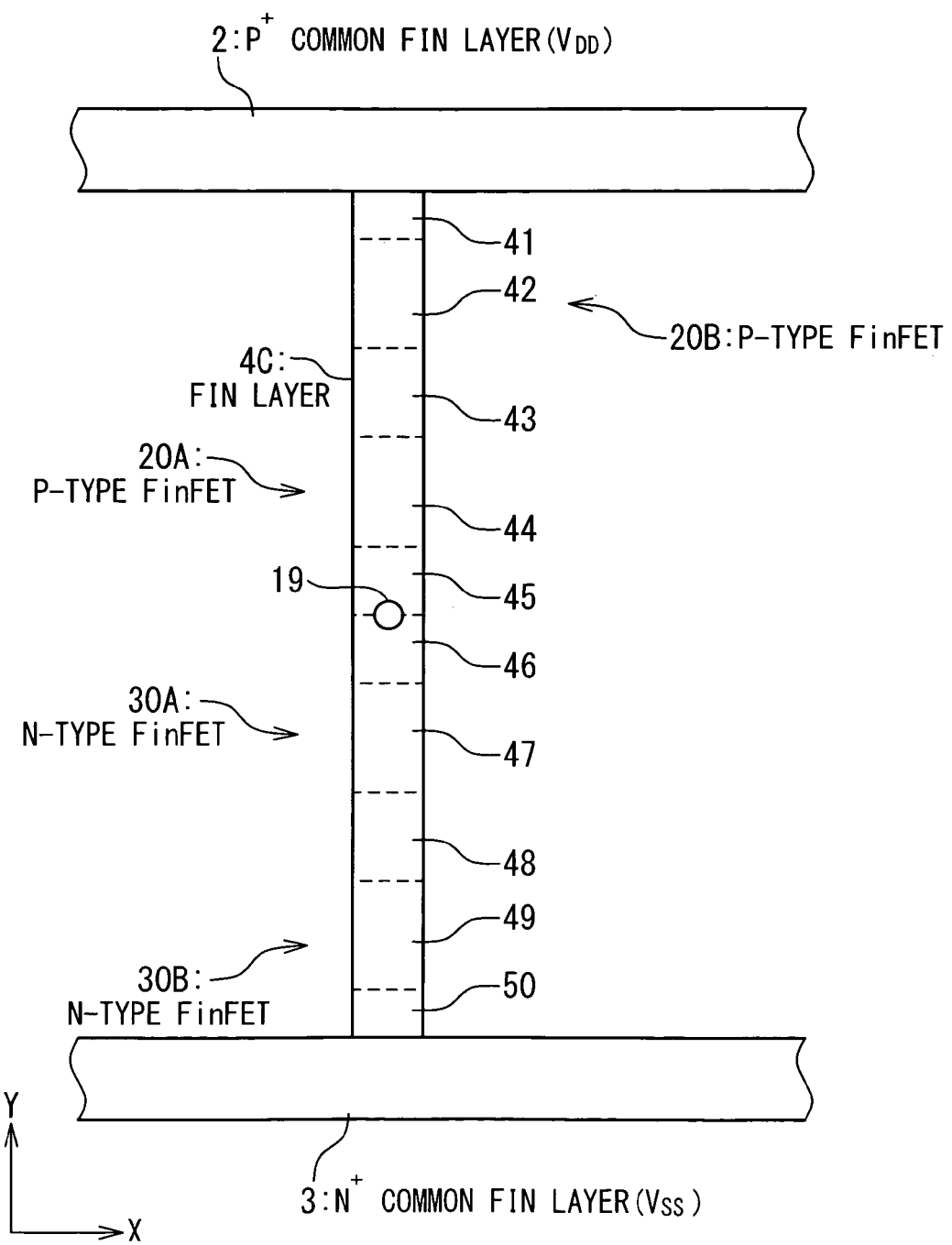
FIG. 10 is a plan view showing a configuration of a fin layer in a fourth embodiment.

More specifically, the semiconductor device 1C has a fin layer 4C which is formed to connect the P+ common source semiconductor layer 2 to the N+ common source semiconductor layer 3. In the present embodiment, the fin layer 4C is formed so as to extend straight in the Y-axis direction. Describing in detail, as shown in FIG. 10, following regions are formed in the fin layer 4C:

(1) a source region 41 and a channel region 42 of the P-type FinFET 20B;

(2) a source/drain region 43 which functions as a drain of the P-type FinFET 20B as well as a source of the P-type FinFET 20A;

(3) a channel region 44 and a drain region 45 of the P-type FinFET 20A;

(4) a drain region 46 and a channel region 47 of the N-type FinFET 30A;

(5) a source/drain region 48 which functions as the source of the N-type FinFET 30A as well as the drain of the N-type FinFET 30B; and (6) a channel region 49 and a source region 50 of the N-type FinFET 30B.

In the present embodiment, the source region 41, the channel region 42, the source/drain region 43, the channel region 44, the drain region 45, the drain region 46, the channel region 47, the source/drain region 48, the channel region 49 and the source region 50 which constitute the P-type FinFETs 20A, 20B and the N-type FinFETs 30A, 30B are aligned along the Y-axis direction.

Referring again to FIG. 9, the gate electrode 14A of the P-type FinFET 20A is formed so as to cover the channel region 44 formed on the fin layer 4C and the gate electrode 14B of the P-type FinFET 20B is formed so as to cover the channel region 42.

Similarly, the gate electrode 15A of the N-type FinFET 30A is formed so as to cover the channel region 44 formed on the fin layer 4C and the gate electrode 15B of the N-type FinFET 30B is formed so as to cover the channel region 49.

Contacts 16A, 17A are formed on the gate electrode 14A of the P-type FinFET 20A and the gate electrode 15A of the N-type FinFET 30A, respectively. The first input interconnection 18A used for a data input of the clocked inverter circuit is connected to the gate electrodes 14A, 15A through the contacts 16A, 17A, respectively.

Similarly, contacts 16B, 17B are formed on the gate electrode 14B of the P-type FinFET 20B and the gate electrode 15B of the N-type FinFET 30B respectively. The second input interconnection 18B used for an enable input of the clocked inverter circuit is connected to the gate electrodes 14B, 15B through the contacts 16B, 17B, respectively.

As shown in FIG. 10, the contact 19 is formed to be joined to both the drain region 45 of the P-type FinFET 20A and the drain region 46 of the N-type FinFET 30A. The contact 19 is connected to the output interconnection 18C which functions as an output of the clocked inverter circuit. In the present embodiment, the output interconnection 18C is formed on a first interconnection layer (a lowermost metal interconnection layer), and the first input interconnection 18A and the second input interconnection 18B are formed on a second interconnection layer (a second metal interconnection layer from the bottom).

When the second input interconnection 18B is turned into a ground level $V_{SS}$, the semiconductor device 1C with such structure functions as an inverter using the first input interconnection 18A as the input and the output interconnection 18C as the output. When the second input interconnection 18B is turned into the power supply level $V_{DD}$, the output interconnection 18C is put into a high impedance state.

As the first to third embodiments, the semiconductor device 1C in the fourth embodiment expresses a high heat dissipation capability. Also with the structure of the fourth embodiment, since the fin layer 4C is formed so as to connect the P+ common source semiconductor layer 2 to the N+ common source semiconductor layer 3, the heat generated in the fin layer 4C can be dissipated through the P+ common source semiconductor layer 2 and the N+ common source semiconductor layer 3 and heat dissipation effect is large.

In addition, the configuration in FIG. 9 in which the fin layer 4C linearly extends in the Y-axis direction is preferable for reducing the size of the clocked inverter circuit in the X-axis direction.

Fifth Embodiment

Figure 11:
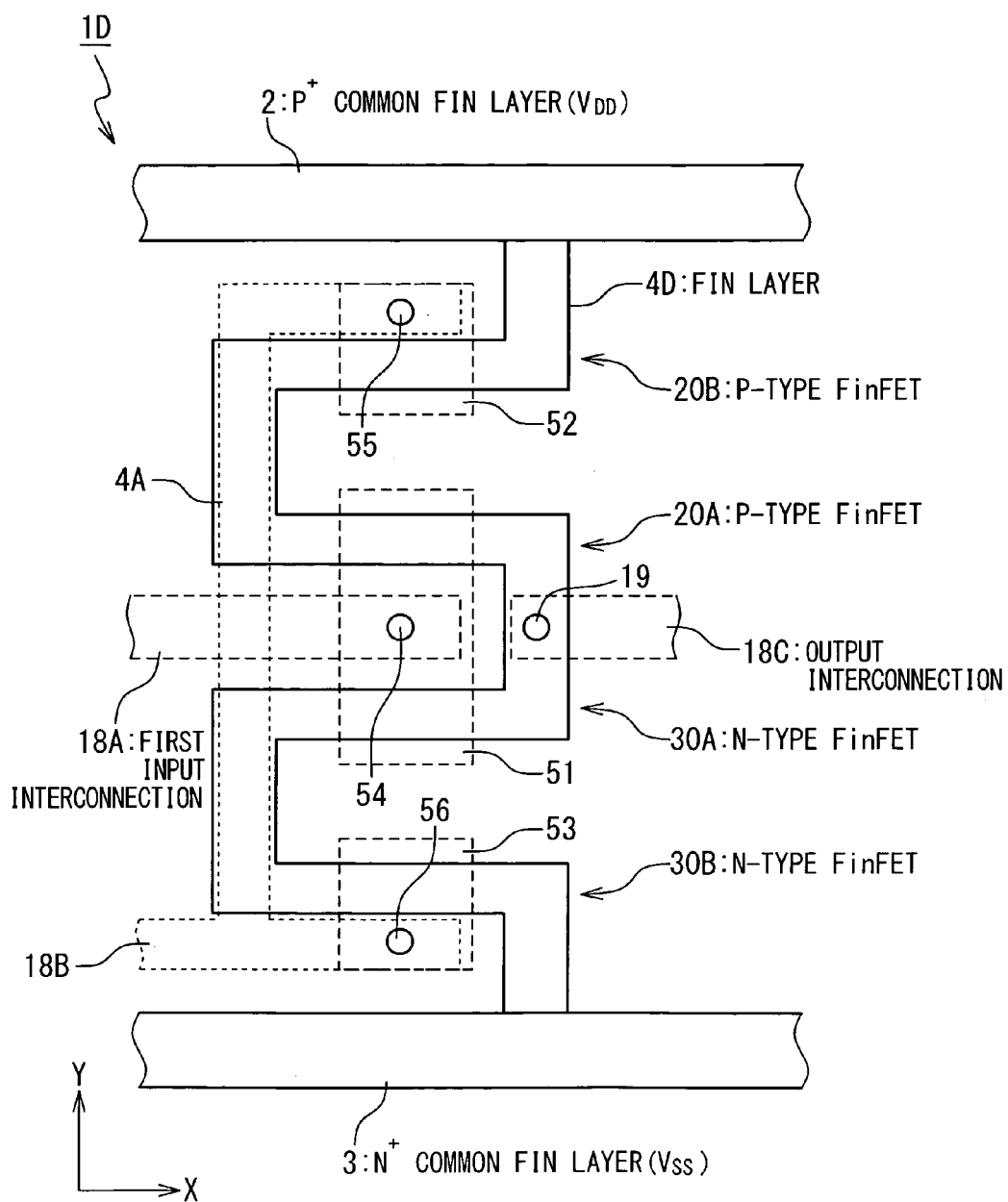
FIG. 11 is a plan view showing a configuration of a semiconductor device according to a fifth embodiment of the present invention.

FIG. 11 is a plan view showing a configuration of a semiconductor device 1D according to a fifth embodiment. The semiconductor device 1D of the fifth embodiment, as in the fourth embodiment, functions as the clocked inverter circuit having the P-type FinFETs 20A, 20B and the N-type FinFETs 30A, 30B. However, in the semiconductor device 1D of the fifth embodiment, as in the second embodiment, the fin layer 4D is bent to reduce the size of the clocked inverter circuit in the Y-axis direction.

Figure 12:
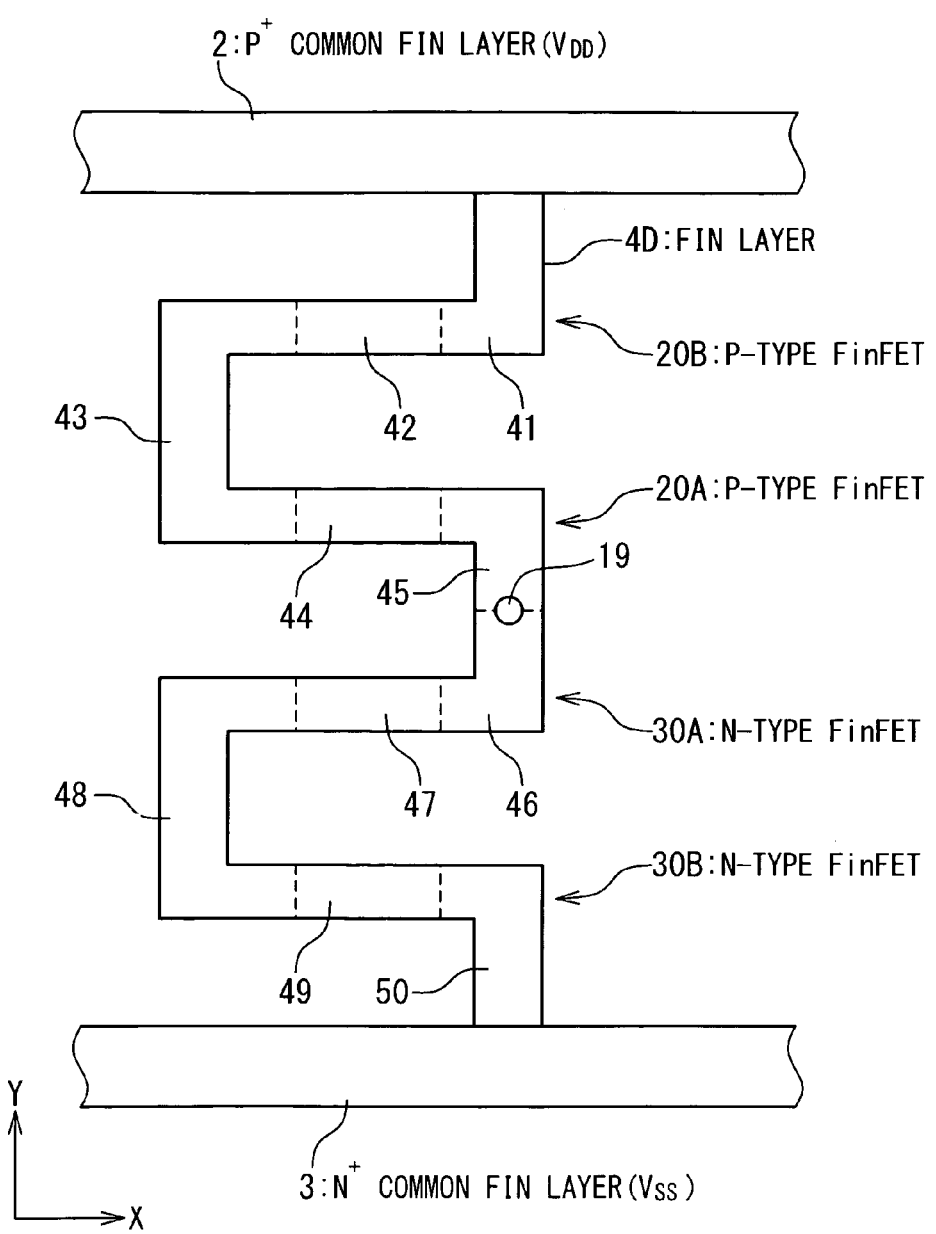
FIG. 12 is a plan view showing a configuration of a fin layer in a fifth embodiment.

Describing in more detail referring to FIG. 12, as in the semiconductor device 1C in the fourth embodiment, the fin layer 4D has the following regions:

(1) the source region 41 and the channel region 42 of the P-type FinFET 20B;

(2) the source/drain region 43 which functions as the drain of the P-type FinFET 20B as well as the source of the P-type FinFET 20A;

(3) the channel region 44 and the drain region 45 of the P-type FinFET 20A;

(4) the drain region 46 and the channel region 47 of the N-type FinFET 30A;

(5) the source/drain region 48 which functions as the source of the N-type FinFET 30A and the drain of the N-type FinFET 30B; and (6) the channel region 49 and the source region 50 of the N-type FinFET 30B, however, the arrangement of these regions is different thereto.

In the semiconductor device 1D according to the fifth embodiment, to reduce a width of the clocked inverter circuit in the Y-axis direction, (a) the source region 41, the channel region 42 and the source/drain region 43 of the P-type FinFET 20B are aligned along the X-axis direction, (b) the source/drain region 43, the channel region 44 and the drain region 45 of the P-type FinFET 20A are aligned along the X-axis direction, (c) the drain region 46, the channel region 47 and the source/drain region 48 of the N-type FinFET 30A are aligned along the X-axis direction, (d) the source/drain region 48, the channel region 49 and the source region 50 of the N-type FinFET 30B are aligned along the X-axis direction.

In addition, the channel regions 42, 44, 47, 49 of the P-type FinFETs 20A, 20B and the N-type FinFETs 30A, 30B are aligned along the Y-axis direction.

Returning to FIG. 11, in the present embodiment, the P-type FinFET 20A and the N-type FinFET 30A shares a common gate electrode 51. The common gate electrode 51 is formed so as to cover the channel regions 44, 47 formed on the fin layer 4D. A gate electrode 52 of the P-type FinFET 20B is formed so as to cover the channel region 42 formed on the fin layer 4D and a gate electrode 53 of the N-type FinFET 30B is formed so as to cover the channel region 49.

A contact 54 is formed on the common gate electrode 51 of the P-type FinFET 20A and the N-type FinFET 30A. The first input interconnection 18A used as a data input of the clocked inverter circuit is connected to the common gate electrode 51 through the contact 54.

Contacts 55, 56 are formed on the gate electrode 52 of the P-type FinFET 20B and the gate electrode 53 of the N-type FinFET 30B, respectively. The second input interconnection 18B used for an enable input of the clocked inverter circuit is connected to the gate electrodes 52, 53 through the contacts 55, 56, respectively.

When the second input interconnection 18B is turned into the ground level VS, the semiconductor device 1D with such structure functions as an inverter using the first input interconnection 18A as the input and the output interconnection 18C as the output. When the second input interconnection 18B is turned into the power supply level $V_{DD}$, the output interconnection 18C is put into the high impedance state.

As the first to fourth embodiments, the semiconductor device 1D of the fifth embodiment expresses a high heat dissipation capability. Also with the structure of the fifth embodiment, since the fin layer 4D is formed so as to connect the P$^+$ common source semiconductor layer 2 to the N$^+$ common source semiconductor layer 3, the heat generated in the fin layer 4D can be dissipated through the P$^+$ common source semiconductor layer 2 and the N$^+$ common source semiconductor layer 3, and thus the heat dissipation effect is high. In addition, the structure in the fifth embodiment is preferable in that the size of the clocked inverter circuit in the Y-axis direction can be reduced. Although the size of the preferable functional circuit is different depending on the whole layout of the chip, the integration density of the logic circuit can be improved by properly using the structures of the fourth and fifth embodiments.

Although various embodiments have been described above, the present invention is not limited to the above-mentioned embodiments.

Figure 13:
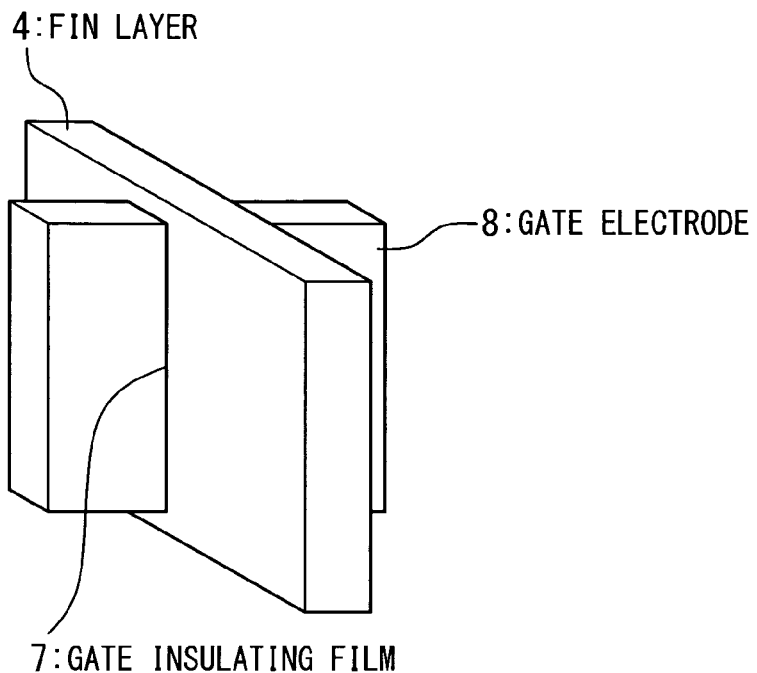
FIG. 13 is a birds-eye view showing another configuration of a three-dimensional FET (FinFET)

For example, although the configurations that the gate electrode stretches over the fin layer is disclosed in the above-mentioned embodiments, a configuration that the fin layer 4 stretches over the gate electrode 8 as shown in FIG. 13 may be adopted. In this case, the gate insulating film 7 is formed on surfaces of the gate electrode 8. Further, the present invention can be applied to many three-dimensional structure MISFETs (exemplified by DG-FET: Double Gate-FET).

Furthermore, the present invention may be embodied as a logic circuit obtained by combining a plurality of logic gate circuits such as inverter circuits and NAND circuits as described in the above-mentioned embodiments. In this case, the fin layer of the FinFET forming each logic gate circuit may be joined to common source semiconductor layers, and fin layers of a former logic gate circuit and a latter logic gate circuit and the common source semiconductor layers may form a rectangular loop. That is, it is preferred that the logic circuit having k logic gate circuits forms k−1 rectangular loops. Even if k−1 rectangular loops are not formed, the fin layers and the common source semiconductor layers are laid out so as to form as many rectangular loops as possible.

This configuration contributes to the heat dissipation and does not deviate from the ideas of the present invention. In a case where k is large, the fin layer and the common source semiconductor layers laid out so as to form about k/2 rectangular loops can achieve enough dissipation capability.

Figure 14:
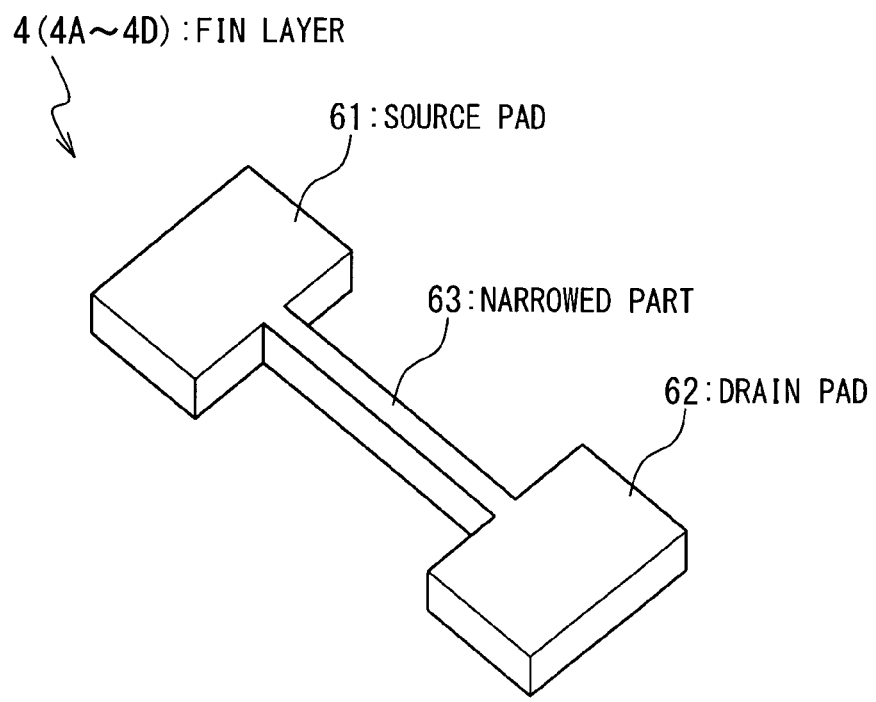
FIG. 14 is a birds-eye view showing a preferred structure of a fin layer.

Furthermore, although the fin layer is shown to have a constant width in above-mentioned embodiments, it is preferred that the part of the fin layer where a channel region of the FinFET is formed is narrow. FIG. 14 is a birds-eye view showing a configuration of the fin layer 4 having a narrow channel region of the FinFET. In FIG. 14, the fin layer 4 has a wide source pad 61, a wide drain pad 62 and a narrowed part 63 sandwiched therebetween. The source pad 61 functions as a source of the FinFET and the drain pad 62 functions as a drain of the FinFET. In addition, the part of the narrowed part 63, which is covered with the gate electrode functions as a channel region and an uncovered part functions as a part of a source region or a drain region. It is desired that the source pad 61 is further extended, thereby obtaining higher heat dissipation effect. It is desired that the drain pad 62 is formed to function as a common drain electrode contact part of the P-type FinFET and the N-type FinFET.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A semiconductor device comprising:
    a first common source semiconductor layer configured to extend in a first direction;
    a second common source semiconductor layer configured to extend in the first direction;
    a first logic gate circuit composed of at least one three-dimensional P-type FET and a three-dimensional N-type FET; and
    a second logic gate circuit composed of at least one three-dimensional P-type FET and a three-dimensional N-type FET,
    wherein a source of the three-dimensional P-type FET in the first logic gate circuit and a source of the three-dimensional P-type FET in the second logic gate circuit are joined to the first common source semiconductor layer, a source of the three-dimensional N-type FET in the first logic gate circuit and a source of the three-dimensional N-type FET in the second logic gate circuit are joined to the second common source semiconductor layer, a drain of the three-dimensional P-type FET of the first logic gate circuit and a drain of the three-dimensional N-type FET of the first logic gate circuit are joined to each other, and a drain of the three-dimensional P-type FET of the second logic gate circuit and a drain of the three-dimensional N-type FET of the second logic gate circuit are joined to each other.

2. The semiconductor device according to claim 1, wherein each of the three-dimensional P-type FET and the three-dimensional N-type FET is a FinFET or a double gate FET.

3. The semiconductor device according to claim 1, wherein a direction of a signal transmitted from the first logic gate circuit to the second logic gate circuit is the first direction.

4. The semiconductor device according to claim 1, wherein a channel region of the three-dimensional P-type FET and a channel region of a semiconductor layer of the three-dimensional N-type FET which are included in the first logic gate circuit are aligned along a second direction perpendicular to the first direction, and a channel region of a semiconductor layer of the three-dimensional P-type FET and a channel region of a semiconductor layer of the three-dimensional N-type FET which are included in the second logic gate circuit are aligned along the second direction.

5. The semiconductor device according to claim 1, wherein a channel region of a semiconductor layer of the three-dimensional P-type FET and a channel region of a semiconductor layer of the three-dimensional N-type FET which are included in the first logic gate circuit are aligned along the first direction, a part of a source region of the three-dimensional P-type FET and a part of a source region of the three dimensional N-type FET which are included in the first logic gate circuit are arranged in a second direction perpendicular to the first direction against the channel region of the first logic gate circuit, and a part of a source region of the three-dimensional P-type FET and a part of a source region of the three dimensional N-type FET which are included in the second logic gate circuit are arranged in a second direction perpendicular to the first direction against the channel region of the second logic gate circuit.

6. The semiconductor device according to claim 1, wherein a drain region of the three-dimensional P-type FET and a drain region of the three-dimensional N-type FET which are included in the first logic gate circuit are joined to form a p-n junction.

7. The semiconductor device according to claim 6, wherein a drain electrode contact is formed to connect to a position where a drain region of the three-dimensional P-type FET and a drain region of the three-dimensional N-type FET which are included in the first logic gate circuit are joined to form a p-n junction.

8. The semiconductor device according to claim 1, wherein a drain region of the three-dimensional P-type FET and a drain region of the three-dimensional N-type FET which are included in the first logic gate circuit are joined via an intrinsic region to which impurity is not doped.

9. The semiconductor device according to claim 1, wherein at least a part of a region composed of a source and a drain of the three-dimensional P-type FET and the three-dimensional N-type FET has a metal silicide structure.

10. The semiconductor device according to claim 1, the first common source semiconductor layer, the second common source semiconductor layer, the three-dimensional P-type FET and the three-dimensional N-type FET which are included in the first logic gate circuit, and the three-dimensional P-type FET and the three-dimensional N-type FET which are included in the second logic gate circuit are arranged to form a quadrangular or more polygonal loop.

11. The semiconductor device according to claim 1, wherein the first logic gate circuit and the second logic gate circuit are respectively one of an inverter circuit, NAND circuit, NOR circuit and a clocked inverter circuit.

12. The semiconductor device according to claim 1, wherein a width of the first common source semiconductor layer and a width of the second common source semiconductor layer are larger than the three-dimensional P-type FET and the three-dimensional N-type FET.

13. The semiconductor device according to claim 1, wherein a sum of a pattern area of the first common source semiconductor layer and a pattern area of the second common source semiconductor layer is larger than a sum of a semiconductor layer of the three-dimensional P-type FET and a semiconductor layer of the three-dimensional N-type FET.

14. The semiconductor device according to claim 1, wherein the first common source semiconductor layer is connected to an interconnection having a power supply potential, and the second common source semiconductor layer is connected to an interconnection having a ground potential.

15. The semiconductor device according to claim 14, wherein the first common source semiconductor layer and the interconnection having the power supply potential are connected through a plurality of contacts, and the second common source semiconductor layer and the interconnection having the ground potential are connected through a plurality of contacts.

16. A semiconductor device comprising:
an insulating layer;
a first semiconductor block formed on said insulating layer extending in a first direction;
a second semiconductor block in contact with said first semiconductor block;
a third semiconductor block in contact with said first semiconductor block;
a first gate electrode formed adjacent to a side surface of said second semiconductor block; and
a second gate electrode formed adjacent to a side surface of said third semiconductor block, wherein each of said first semiconductor block, said second semiconductor block, and said third semiconductor block has a same height from a top surface of said insulating layer.

17. The semiconductor device according to claim 16, wherein said second semiconductor block has first source node at one end thereof connected to said first semiconductor block and first drain node at another end thereof, and wherein said third semiconductor block has second source node at one end thereof connected to said first semiconductor block and second drain node at another end thereof, and wherein said first and said second source nodes are supplied with first power potential through the first semiconductor block and said first and said second drain nodes output signals in response to respective potentials at said first and said second gates.

18. The semiconductor device according to claim 17, further comprising:
a fourth semiconductor block formed on said insulating layer extending in the first direction;
a fifth semiconductor block in contact with said fourth semiconductor block;
a third gate electrode formed on a side surface of said fifth semiconductor block,
said fifth semiconductor block has third source node at one end thereof connected to said fourth semiconductor block and third drain node at another end thereof,
said third source node is supplied with second power potential through the fourth semiconductor block and said third drain node outputs signal in response to potential at said third gate,
said first drain node and third drain node are in contact with each other.

19. The semiconductor device according to claim 18, further comprising:
a sixth semiconductor block in contact with said fourth semiconductor block;
a fourth gate electrode formed on a side surface of said sixth semiconductor block,
said sixth semiconductor block has fourth source node at one end thereof connected to said fourth semiconductor block and fourth drain node at another end thereof,
said second drain node and fourth drain node are in contact with each other.

20. The semiconductor device according to claim 18, further comprising:
a sixth semiconductor block in contact with said fourth semiconductor block; and
a fifth gate electrode formed on a side surface of said sixth semiconductor block, said fifth gate electrode arranged between said third drain node and said third gate electrode.

21. A semiconductor device comprising:
an insulating layer;
a first semiconductor block formed on said insulating layer extending in a first direction;
a second semiconductor block in contact with said first semiconductor block;
a third semiconductor block in contact with said first semiconductor block;
a first gate electrode formed adjacent to a side surface of said second semiconductor block; and
a second gate electrode formed adjacent to a side surface of said third semiconductor block, wherein each of said first semiconductor block, said second semiconductor block, and said third semiconductor block has a same height from a top surface of said insulating layer, and wherein each of the first gate electrode and the second gate electrode has a bent portion, wherein the bent portion is bent in a length direction of a channel.

* * * * *